United States Patent [19]
Witzman et al.

[11] Patent Number: 6,037,192
[45] Date of Patent: Mar. 14, 2000

[54] PROCESS OF ASSEMBLING AN INTEGRATED CIRCUIT AND A TERMINAL SUBSTRATE USING SOLDER REFLOW AND ADHESIVE CURE

[75] Inventors: Sorin Witzman; Elizabeth M. Tencer, both of Ottawa; Michal S. Tencer, Nepean; William T. Davies, Kanata; Richard S. Kubin, Carleton Place, all of Canada

[73] Assignee: Nortel Networks Corporation, Montreal, Canada

[21] Appl. No.: 09/012,008

[22] Filed: Jan. 22, 1998

[51] Int. Cl.⁷ .................... H01L 21/283; H01L 21/58; H01L 21/60
[52] U.S. Cl. .................. 438/118; 438/615; 228/180.22
[58] Field of Search ................................ 438/118, 615; 228/180.22

[56] References Cited

U.S. PATENT DOCUMENTS

| | | |
|---|---|---|
| 3,392,442 | 7/1968 | Khoury et al. |
| 5,784,261 | 7/1998 | Pedder . |
| 5,960,308 | 9/1999 | Akagawa et al. |

Primary Examiner—David E. Graybill
Attorney, Agent, or Firm—Reginald J. Austin; Victoria Donnelly

[57] ABSTRACT

A method of assembling an integrated circuit component onto a substrate by the use of a polymer adhesive having fluxing properties and a specified adhesive strength and temperature control volumetric change which is greater than that of a solder to be used between terminals of the component to terminals of the substrate. In the method the uncured polymer adhesive is located between the circuit component and the substrate and as the second component moves into its site position upon the substrate, the uncured polymer adhesive is compressed and is displaced outwardly from between the body of the component and the substrate. In the method, as an exterior force is required to displace the adhesive in this manner, glass microspheres are provided within the adhesive to limit the movement of the integrated circuit components towards the substrate. These microspheres are of a specified grid size and should also be sufficiently large to prevent glass microspheres from becoming trapped between the terminals of the component and of the substrate. The polymer adhesive has fluxing properties which enables it to be partially cured initially to hold the integrated circuit component in its required position, the curing action then being completed during a reflow soldering operation performed to join terminals of the component to the terminals of the substrate.

10 Claims, 1 Drawing Sheet

PROCESS OF ASSEMBLING AN INTEGRATED CIRCUIT AND A TERMINAL SUBSTRATE USING SOLDER REFLOW AND ADHESIVE CURE

This invention relates to assemblies of integrated circuit components and substrates.

At present, an integrated circuit component is attached to a substrate in a series of well known steps in any assembly procedure in which terminals of the component are soldered to terminal pads of the substrate at a location site for the component and the substrate. In the assembly procedure, a flux is applied across the location site so as to contact the terminal pads, the component is placed correctly in its required position upon the substrate, and reflow soldering then takes place followed by a flux cleaning operation. The latter step is not required if a "no clean" flux has been used. Integrated circuit components are known to have different coefficients of expansion (expansion rates) from substrates. Unless further securement is involved, changes in temperature during use would place great strain upon the components and upon solder connections between the terminals and terminal pads breakage in connections would occur in many, if not all, structural assemblies. In order to prevent this from happening, or at least to minimize this possibility, an integrated circuit component is more securely connected to the substrate with a polymer adhesive which is disposed between the body of the integrated circuit component and the substrate. Conventionally, the adhesive is applied by injecting it in flowable form between the integrated circuit component and the substrate and then the adhesive needs to be cured to dry it, solidify it, and cause it to positively hold the integrated circuit component in position. Because the adhesive is required to be in flowable state to inject it, its curing and solidification step involves a phenomenal amount of time which should be totally unacceptable during commercial manufacture, because it far exceeds the total time for all other manufacturing steps. However, because no other acceptable process for providing adherence between an integrated circuit component and a substrate has been found and which strengthens the integrated circuit component when in position thereby preventing breakage, it is a manufacturing time which has had to be accepted grudgingly by industry. The time involved by adhesive insertion and curing of the adhesive may approach 10 hours. There are also further problems. When no clean flux is used, in the event that flux does remain, it may have the effect of lowering the adhesion strength of the adhesive. Also, in order to produce high quality adhesive (with no voids) and to ensure the most acceptable manufacturing time, certain properties of the material, e.g. the viscosity of the uncured adhesive material as well as its filler content, must be selected according to the requirements of the injection step. However, these requirements may act against the attainment of specific properties of the cured adhesive including mechanical and electrical properties of the cured adhesive.

The present invention seeks to provide a method of assembling an integrated circuit component onto a substrate in which the assembly time is significantly reduced and, in the final product, the integrated circuit component is protected from strain or breakage associated with differential degrees of temperature induced expansion and contraction between the component and the substrate.

Accordingly, the present invention provides a method of assembling an integrated circuit component onto a substrate comprising applying an uncured polymer adhesive having fluxing properties over and in contact with a site area on a substrate for the integrated circuit component, the polymer adhesive, after curing, having an adhesive strength of at least 50 mPa, sufficient rigidity to hold the integrated circuit component as part of a rigid structure together with the substrate and a temperature controlled volumetric change greater than that of the solder to be used in the method; locating the integrated circuit component in desired location upon the site with the uncured polymer adhesive between and in surface contact with the integrated circuit component and the substrate; and with the adhesive retaining the integrated circuit component in its desired location, increasing the ambient temperature; a) to reflow solder terminals of the integrated circuit component to terminal pads of the substrate while the flux in the polymer adhesive provides an oxide cleaning action to the surfaces to be joined; and b) to cure the polymer adhesive to provide it with its required properties.

In following the above process, the terminals of the integrated circuit component displace the uncured polymer adhesive so as to contact solder material providing the terminal pads with the flux thereby providing an oxide cleaning action between the solder and the terminals. Dependent upon viscosity and adhesive qualities of the uncured adhesive to result in the integrated circuit component being held in its desired location during the soldering step, it may be necessary to partly cure the adhesive before soldering and then to provide the final curing step during soldering.

Apart from the adhesive and rigidity properties required, the volumetric change in the adhesive during cooling is of the utmost important. Shrinkage of the cured adhesive during cooling, if greater than that of the solder, moves the integrated circuit component towards the substrate surface thereby forcing the solder at the terminal positions into compression. In use of the assembly, the operational temperatures never achieve the temperatures achieved during the assembly process so that the adhesive continues to maintain the solder in compression even during use. As a result of this, the solder joints cannot become broken because of tensile stresses placed upon them thereby improving the reliability of the solder joints at the terminal positions.

Embodiments of the invention will now be described, by way of example, with reference to the accompanying drawings, in which.

Figure 1:
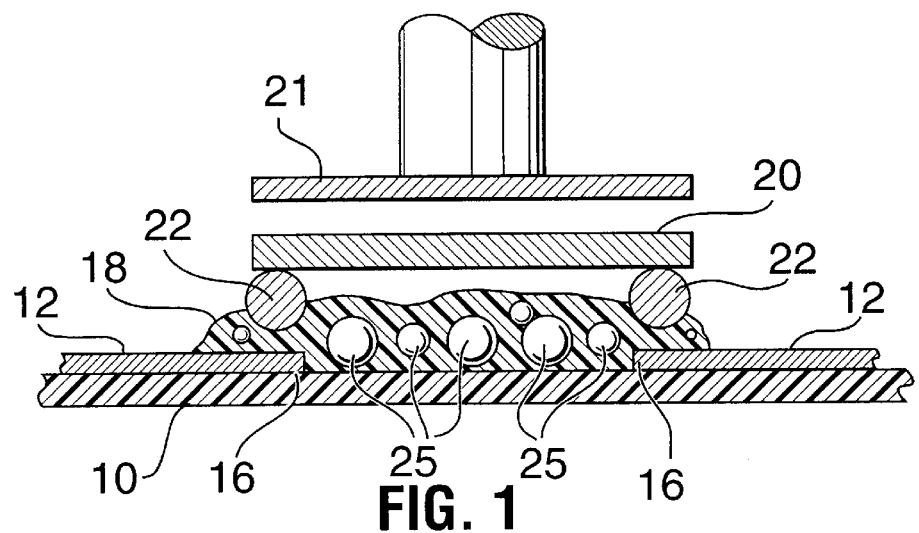
FIG. 1 is a cross-sectional view through a printed circuit board showing a first stage in a method of assembling an integrated circuit component onto the board according to a first embodiment.

In the first embodiment as shown in FIG. 1, a printed circuit board 10 has a plurality of conductors 12 on one surface of the board the conductors having solderable pads 16 at terminal. The solderable pads 16 are positioned in desired locations in well known manner preparatory to the solder connection to the terminal ends of an integrated circuit component.

Before a circuit component is positioned in its desired location upon the board for connection to the solderable pads 16, an uncured polymer adhesive 18 is dispensed over the site area of the board 10 upon which the integrated circuit component is to be located. The adhesive may extend so as to cover the solderable pads 16 as shown in FIG. 1. Alternatively, the adhesive is applied to the component e.g. by pressing the component into a quantity of the adhesive and withdrawing some of the adhesive with the component. This uncured polymer adhesive includes fluxing components for use in a soldering operation, i.e. for oxide removal from the surfaces of the solderable pads 16 and from solder ball terminals of the integrated circuit component (to be described).

The uncured polymer adhesive contains a means for providing a limit to the minimum distance between a body of the circuit component and the board 10 for use as discussed below. In this embodiment, means for providing the minimum distance limit comprises a plurality of glass microspheres having a predetermined maximum size which is consistent with the minimum distance between the component and the board. Also, the glass microspheres have a predetermined minimum size to prevent any of them from being present in the solder terminal positions after assembly also as will be described. The maximum and minimum sizes are determinable for specific component structures, perhaps experimentally. However, in the case of this embodiment, the glass microspheres are from 3 to 5 mil in diameter.

In this embodiment, the uncured polymer adhesive is of the following composition:

| COMPONENT | SUPPLIER | PARTS BY WEIGHT |
| --- | --- | --- |
| BISPHENOL A EPOXY DIACRYLATE | RADCURE | 85 to 115 |
| GLYCEROL DERIVATIVE | RADCURE | 19 to 21 |
| DICUMYL PEROXIDE | ALDRICH | 0.060 to 0.070 |
| 4-METHOXYPHENOL | ALDRICH | 0.9 to 1.1 |
| GLASS MICROSPHERES | CANASPHERE INDUSTRIES | 24 to 50 |
| SILANE Z6032 | DOW CORNING | 3 to 5 |
| DEFOAMER BYK A500 | BYK CHEMIE | 0.3 to 0.7 |
| PHOTOINITIATOR CGI 1700 | CIBA GEIGY | 2 to 4 |

Of the above composition, the glycerol derivative, dicumyl peroxide and 4-methoxyphenol provide a fluxing action. Silane Z6032 is an adhesion promoter to both the circuit component body and to the glass microspheres. Expansion and outgassing of acrylic material during curing is prevented by defoamer BYK A500 while photoinitiator CGI 1700 assists in partial curing of the adhesive under ultraviolet light. In addition, the concentration of the glass microspheres is dependent upon the mechanical properties required for the cured polymer adhesive.

The uncured polymer adhesive according to the above formulation is in the form of a paste. Because of the presence of the photoinitiator, the adhesive is curable by exposure to ultraviolet light with partial curing occurring over small time periods which will be explained below. The material, either fully uncured or partially cured, necessarily has sufficient adhesive strength and high viscosity as to retain the integrated circuit component in desired position before soldering takes place, and after curing has an adhesive strength of at least 50 mPa together with sufficient rigidity to hold the component to the board. The above formulation after curing also essentially has a temperature controlled volumetric change greater than that of the solder in the solderable pads 16. This particular formulation has a temperature controlled volumetric change rate of at least 27 ppm/° C. The curing temperature is high and above the solder melting temperature. Thus, upon cooling, shrinkage of the cured material will draw the integrated circuit component towards the board and place the solder in compression at the solder joints. The temperature in use of the finished assembly will be always lower than the solder melt temperature and hence the cured material will hold the solder continuously in compression thereby preventing solder joint failures due to tensile stresses.

After the application of the uncured adhesive 18, an integrated circuit component 20 (FIGS. 1 and 2) is placed in a desired position and has solder ball terminals 22 aligned vertically with the solderable pads 16 on the board. As will be seen from the figures of the drawings, the glass microspheres 25 are shown. As will be appreciated, these microspheres are illustrated in a scale far greater than their actual size in comparison to other features of the drawings. The reason for this scale increase is to assist the description illustrating how the inventive process works and how the glass microspheres take part in this process. The integrated circuit component is then forced downwardly, by an automatically operated pressure platen 21, with sufficient pressure to cause the terminals 22 to displace the adhesive 18 from directly above the solderable pads 16. The downward movement also causes the undersurface of the component 20 to contact the adhesive 18 and then displace the adhesive outwardly beneath the sides of the component. The adhesive thus fills all voids between component and board and provides strengthening adhesive edge fillets 23 extending from the component to the board outside boundary edges of the board. The surfaces of the solder pads and the terminals 22 become wetted with the flux from the adhesive preparatory to the reflow soldering operation subsequently to take place.

Figure 2:
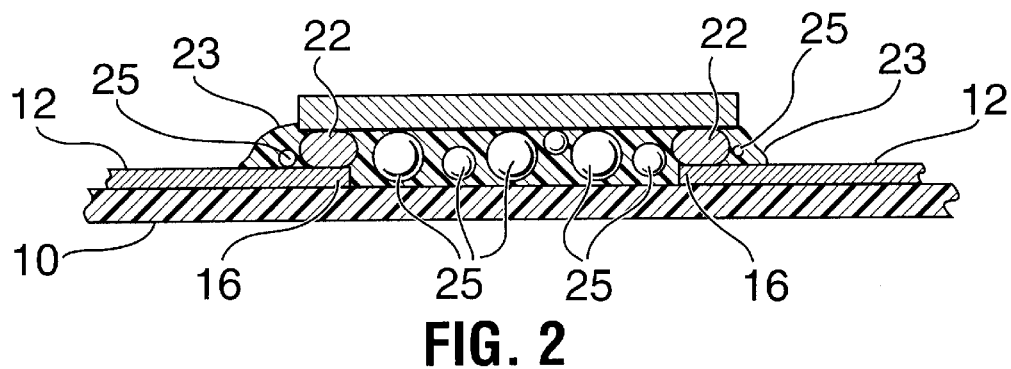
FIG. 2 is a view similar to FIG. 1 showing he finished assembly.

The position of the pressure platen 21 needs to be controlled so as to locate the body of the component 20 in a desired location above the circuit board 10 whereby the solder connections between the solderable pads 16 and the solder ball terminals 22 may be correctly made. Downward position is controlled by the glass microspheres 25, which are non-compressible, and therefore provide a limit to the minimum distance between the body of the circuit component and the circuit board. In other words, some of the glass microspheres while being displaced outwardly with the adhesive during descent of the component 20 remain between the body of the component 20 and the board and are ultimately engaged upon upper and lower surfaces by the body of the component and by the board, as shown in FIG. 2. The non-compressible nature of the glass microspheres terminates the downward movement of the platen to provide a distance between the body of the component and of the board of about 5 mil which is determined by the maximum size of the microspheres. The minimum size of 3 mil of the microspheres is also important, because this ensures that all microspheres are of too large a diameter to become trapped between the solderable pads 16 and the solder ball terminals 22. If small microspheres were to become trapped in this manner, they would become at least partly embedded in solder terminal joints which could weaken, perhaps seriously the mechanical strength and electrically conducting capability of the joints. The displacement of any glass microspheres 25 from directly between the solderable pads 16 and the solder ball terminals 22 and the general outward displacement of the adhesive also results in some microspheres being present in the edge fillets 23, for instance as shown by FIG. 2. Upon the integrated circuit component being in its desired location as shown in FIG. 2, the undersurface of the component 20 is intimately contacted by the adhesive 18. The region occupied by the component is then subjected to ultra violet light exposure for a relatively short period, e.g. 1 to 2 seconds. This short exposure produces partial curing of the adhesive thereby providing it with sufficient adhesive strength to retain the component 20 in its desired location with the terminals 22 aligned with the solderable pads 16. The reflow soldering operation then takes place at an elevated temperature during which the adhesive 18 becomes fully cured under the high temperature conditions. During soldering the flux in the adhesive acts in desired manner for removal of oxide film from between the surfaces which the soldering operation is required to join together.

The curing of the adhesive in this manner eliminates a subsequent curing step which is normally lengthy and is required in conventional processes. As a result, the inventive process provides an extremely quick method of providing an assembly of an integrated circuit component upon a substrate. In addition to this, because the adhesive is such that it can be applied to the selected site for the component prior to location of the component in position, then the adhesive is not required to have properties to allow it to be injected into a relatively narrow space between the component and substrate. Hence, the lack of need for the property of such flowability for the uncured adhesive enables a greater scope for formulation of the adhesive for the purpose of providing its most essential properties, i.e. rigidity, adhesive strength and temperature controlled volumetric change. The process is also of shorter duration as mentioned above and may be easily incorporated into an in-line manufacturing process.

The first and second embodiments (the second embodiment to be described) show that with the process of the invention, the integrated circuit components may be added to a circuit board with adhesive attachment during the stage of placement of other electronic components and at the same station in an in-line manufacturing process. In addition, the properties of the adhesive of the invention permit its partial curing and allow for reheating of the adhesive after partial curing thereby permitting the use of a solder reflow process to positively fuse the solderable pads 16 of the circuit board to the solder ball terminals of the integrated circuit component or components. The particular characteristic of the partially cured adhesive eliminates the requirement to solder an integrated circuit component in position by a further or different process step.

Figure 3:
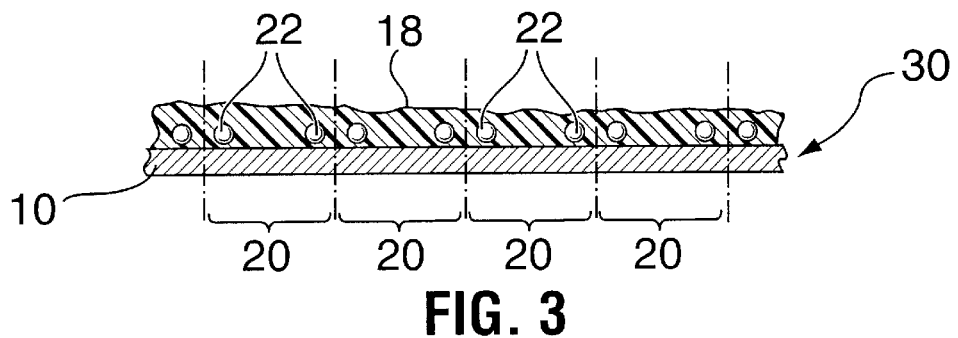
FIG. 3 is a sectional view through a wafer for making a plurality of integrated circuit components and shows one stage in a method of assembly according to a second embodiment.
Figure 4:
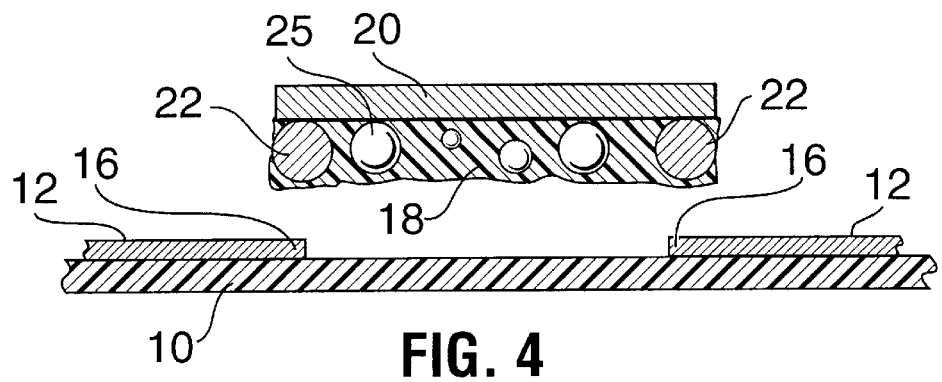
FIG. 4 is a view similar to FIG. 1 showing a further stage in the assembly method according to the second embodiment.

In a second embodiment, now to be described, the uncured polymer adhesive having the composition described above in the first embodiment is applied to the integrated circuit component 20 instead of to the circuit board as in the first embodiment. Conveniently, to apply the uncured adhesive to the component 20 in a practical manner, the adhesive is applied to a processed wafer 30 for providing a plurality of integrated circuit components 20 before separation of the wafer into the individual components. As shown by FIG. 3, the processed wafer 30 comprises a plurality of the components 20 each having the solder ball terminals 22 already located in position upon the wafer by a screening process as well known in the art. In FIG. 3, the chain-dotted lines shown therein represent the lines of separation of the integrated circuit components 20. With the wafer in an inverted position as in FIG. 3, i.e. with the solder ball terminals 22 facing upwardly, the adhesive 18 in paste form is spread across the upper surface of the wafer and in contact with the solder ball terminals 22. The adhesive is then partially cured to achieve a solid state matrix. The wafer is then separated into the individual integrated circuit components 20 according to conventional practice and each integrated circuit component is inverted in position to the position shown in FIG. 4 for its application onto its printed circuit board 12. The adhesive 18 which underlies and is carried by each of the components 20 as the component is moved downwards towards the circuit board, becomes displaced in the manner described with regard to the first embodiment to result in a structure similar to that of FIG. 2. In other words the adhesive is contained between component and printed circuit board 10, the glass microspheres 25 provide the spacing between component and board and fillets 23 are provided outside edges of the component, these fillets perhaps containing some of the glass microspheres 25. Partial curing of adhesive and a reflow soldering operation then takes place as described with regard to the first embodiment to give the final assembly of component onto the board and with the adhesive fully cured.

What is claimed is:

1. A method of assembling an integrated circuit component, comprising a component body and a plurality of electrical terminals carried by the component body, onto a substrate comprising:

locating the integrated circuit component in position spaced from a desired site area for the component upon the substrate with an uncured polymer adhesive disposed between the body of the component and the site area, the uncured polymer adhesive having fluxing properties and, after curing, having an adhesive strength of at least 50 mPa, sufficient rigidity to hold the integrated circuit component as part of a rigid structure together with the substrate, and temperature controlled volumetric change greater than that of the solder to be used to join terminals of the component to terminals of the substrate;

relatively moving the integrated circuit component and the substrate to bring the component towards the substrate and into a desired location upon the site area while compressing the uncured polymer adhesive between the body of the component and the substrate to displace the adhesive outwardly from between the body of the component and the substrate, and limiting the minimum distance apart of the body of the component and the substrate; and with the adhesive retaining the integrated circuit component in its desired location, applying heat;

a) to reflow solder to provide terminal connections between the component and the substrate while the flux in the polymer adhesive provides an oxide cleaning action to enable soldering between terminals to occur; and b) to cure the polymer adhesive to provide it with its required properties.

2. A method according to claim 1 comprising locating the polymer adhesive over and in contact with the site area so as to extend across the terminals of the substrate, and moving the component into contact with the adhesive and into its desired location while applying sufficient pressure to cause displacement of the uncured polymer between terminals of the component and the substrate as the terminals approach one another; the flow in the adhesive wetting the surfaces to provide the oxide cleaning action.

3. A method according to claim 2 including partially curing the polymer adhesive after positioning of the component in its desired location and before reflow soldering so as to retain the component in its desired position.

4. A method according to claim 3 wherein the uncured adhesive includes a photoinitiator and the partial curing comprises subjecting the uncured adhesive to ultraviolet light to trigger the photoinitiator to partially cure the polymer adhesive.

5. A method according to claim 1 wherein the uncured polymer adhesive is positioned within the site area so as to extend closely adjacent to the terminal pads and, during positioning of the component in its desired location, the component compresses the uncured adhesive so as to move the adhesive across the terminal pads, the terminals of the component then displacing the adhesive over the terminal pads so as to lie close to the terminal pads with the flux being present between the terminals and the terminal pads to provide the oxide cleaning action.

6. A method according to claim 1 comprising applying the uncured polymer adhesive to the site area of the substrate before the integrated circuit component is located in position spaced from the site area.

7. A method according to claim 1 comprising applying the uncured polymer adhesive to the body of the integrated circuit component before the component is located in position spaced from the site area.

8. A method according to claim 7 wherein the integrated circuit component is one of a plurality of individual integrated circuit components formed from a processed wafer, and before separation of the individual components from the wafer, the method comprises coating a surface of the wafer with the uncured polymer adhesive, and then separating the wafer into the individual integrated circuit components with the body of each component carrying a required amount of polymer adhesive.

9. A method according to claim 1 comprising limiting the minimum distance apart of the body of the component and the substrate by the incorporation into the uncured polymer adhesive of a desired quantity of glass microspheres, the glass microspheres having a size between specified upper and lower limits, the method further comprising moving the integrated circuit component towards the substrate while compressing the uncured polymer adhesive, the minimum distance apart of the body of the component and the substrate being determined by engagement of the body and of the substrate on either side of a plurality of the glass microspheres of the largest size, the minimum size of the glass microspheres preventing glass microspheres from becoming trapped between the terminals of the integrated circuit component and of the substrate.

10. A method according to claim 9 wherein the adhesive is displaced outwardly from between the body of the component and the substrate so as to provide uncured polymer adhesive outwardly of boundaries of the body of the component and after curing of the adhesive, the adhesive disposed outwardly of the body of the component provides fillets of adhesive extending down to the substrate.

* * * * *